United States Patent
Huffman, Jr. et al.

(10) Patent No.: US 10,302,289 B2
(45) Date of Patent: May 28, 2019

(54) LIGHTING POLE WITH ISOLATED AXIAL CHAMBERS

(71) Applicant: KEARNEY-NATIONAL INC., New York, NY (US)

(72) Inventors: Charles R. Huffman, Jr., Kingsport, TN (US); Gregory D. Mercier, Abingdon, VA (US); Tonya Bowers Johnson, Bluff City, TN (US)

(73) Assignee: KEARNEY-NATIONAL INC., New York, NY (US)

( * ) Notice: Subject to any disclaimer, the term of this patent is extended or adjusted under 35 U.S.C. 154(b) by 0 days.

(21) Appl. No.: 15/786,692

(22) Filed: Oct. 18, 2017

(65) Prior Publication Data

US 2018/0356082 A1 Dec. 13, 2018

Related U.S. Application Data

(60) Provisional application No. 62/517,288, filed on Jun. 9, 2017.

(51) Int. Cl.
| | |
|---|---|
| *E04H 12/08* | (2006.01) |
| *F16L 13/02* | (2006.01) |
| *F21V 23/00* | (2015.01) |
| *H05K 9/00* | (2006.01) |
| *F21S 8/08* | (2006.01) |

(52) U.S. Cl.
CPC ......... *F21V 23/002* (2013.01); *E04H 12/08* (2013.01); *E04H 12/085* (2013.01); *F16L 13/02* (2013.01); *F16L 13/0209* (2013.01); *F16L 13/0218* (2013.01); *F21S 8/085* (2013.01); *H05K 9/0081* (2013.01)

(58) Field of Classification Search
CPC ..... E04H 12/08; E04H 12/085; F21V 23/002; F21S 8/085; F16L 13/02
USPC .......................... 52/843, 852, 834; 285/288.1
See application file for complete search history.

(56) References Cited

U.S. PATENT DOCUMENTS

| | | | | |
|---|---|---|---|---|
| 415,325 | A * | 11/1889 | Greene .................. | E04H 12/08 52/848 |
| 726,801 | A * | 4/1903 | Maxwell ................. | F16L 9/18 138/115 |
| 745,570 | A * | 12/1903 | Clarke .................... | 138/158 |
| 1,990,077 | A * | 2/1935 | Kershaw ................ | F16L 13/0227 219/137 R |
| 2,037,962 | A * | 4/1936 | Brown ................... | F16L 13/0209 285/22 |
| 2,789,669 | A * | 4/1957 | Pfaff, Jr. .............. | E04H 12/2261 403/253 |
| 3,092,222 | A * | 6/1963 | Heinle .................. | E04C 3/32 138/116 |
| 3,325,950 | A * | 6/1967 | Pfaff, Jr. .............. | E04H 12/085 362/431 |

(Continued)

FOREIGN PATENT DOCUMENTS

DE 9106747 U1 * 8/1991 ............. E04B 2/744

*Primary Examiner* — Adriana Figueroa
(74) *Attorney, Agent, or Firm* — Buchanan Ingersoll & Rooney PC

(57) ABSTRACT

A lighting pole is disclosed, which includes a hollow tube, and at least two nonintersecting walls extending over an axial length of the hollow tube to divide an interior of the hollow tube into at least three isolated chambers. At least one of the three isolated chambers defines a gap separating at least two of the isolated chambers.

12 Claims, 3 Drawing Sheets

(56) References Cited

U.S. PATENT DOCUMENTS

| | | | | |
|---|---|---|---|---|
| 4,803,819 | A * | 2/1989 | Kelsey | B29C 70/521 |
| | | | | 174/45 R |
| 5,870,877 | A * | 2/1999 | Turner | B29C 70/52 |
| | | | | 52/309.1 |
| 6,155,017 | A * | 12/2000 | Turner | B29C 70/305 |
| | | | | 248/354.4 |
| 6,191,355 | B1 * | 2/2001 | Edelstein | E04H 12/08 |
| | | | | 174/45 R |
| 6,898,882 | B2 * | 5/2005 | Kim | G09F 7/18 |
| | | | | 248/345.1 |
| 7,543,733 | B2 * | 6/2009 | Wastiaux | B01J 19/0053 |
| | | | | 228/126 |
| 7,722,085 | B2 * | 5/2010 | Pionetti | F16L 1/19 |
| | | | | 285/55 |
| 8,256,089 | B2 * | 9/2012 | Pionetti | B05D 1/002 |
| | | | | 118/318 |
| 8,474,221 | B1 * | 7/2013 | Ceko | H02G 7/20 |
| | | | | 174/45 R |
| 2010/0115813 | A1 * | 5/2010 | Davidson | G09F 15/0037 |
| | | | | 40/607.01 |
| 2011/0134653 | A1 | 6/2011 | Williams | |
| 2012/0279776 | A1 | 11/2012 | Mizutani | |
| 2013/0067856 | A1 * | 3/2013 | Woolstencroft | E04B 1/944 |
| | | | | 52/834 |
| 2014/0252757 | A1 * | 9/2014 | Raber | F16L 13/0263 |
| | | | | 285/55 |

\* cited by examiner

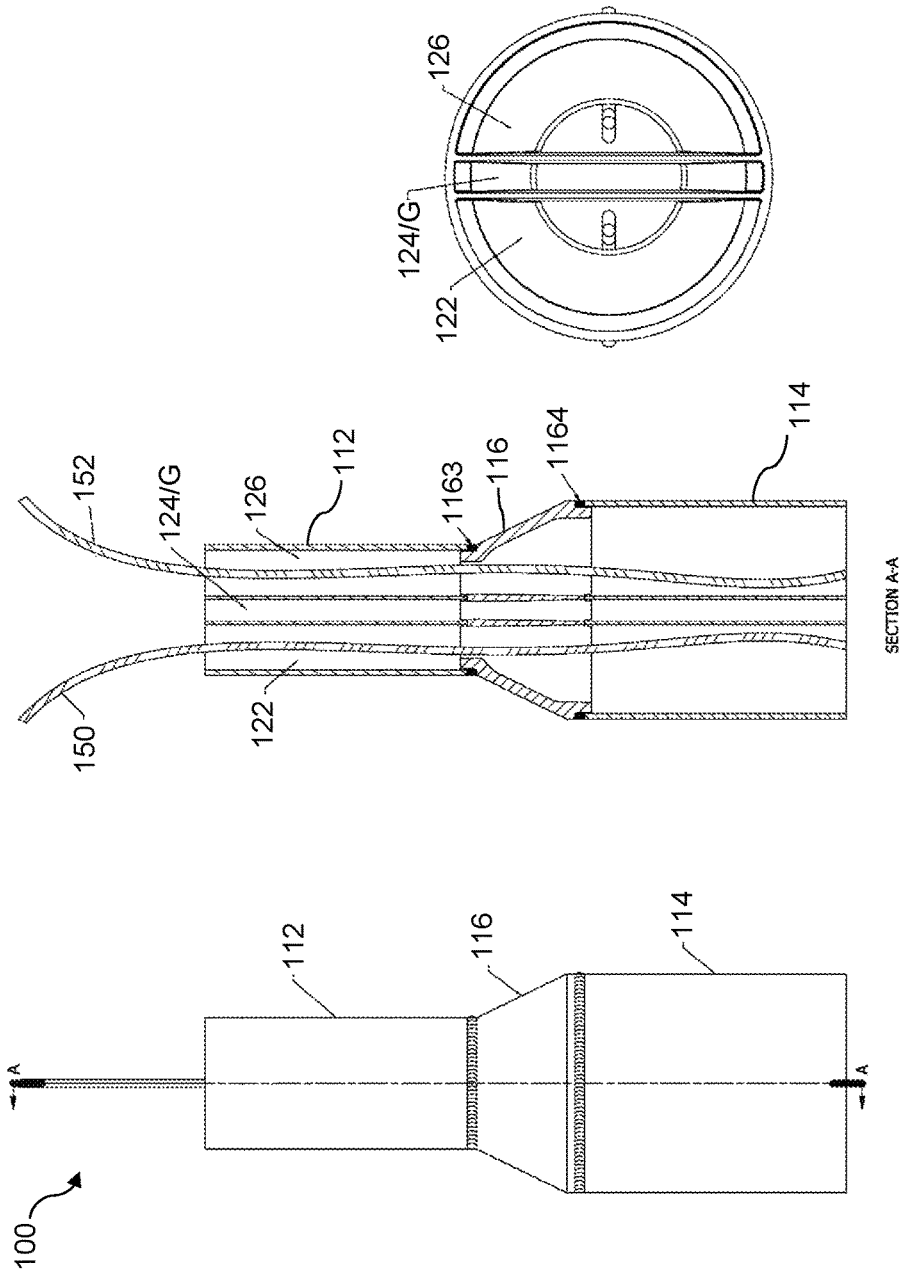

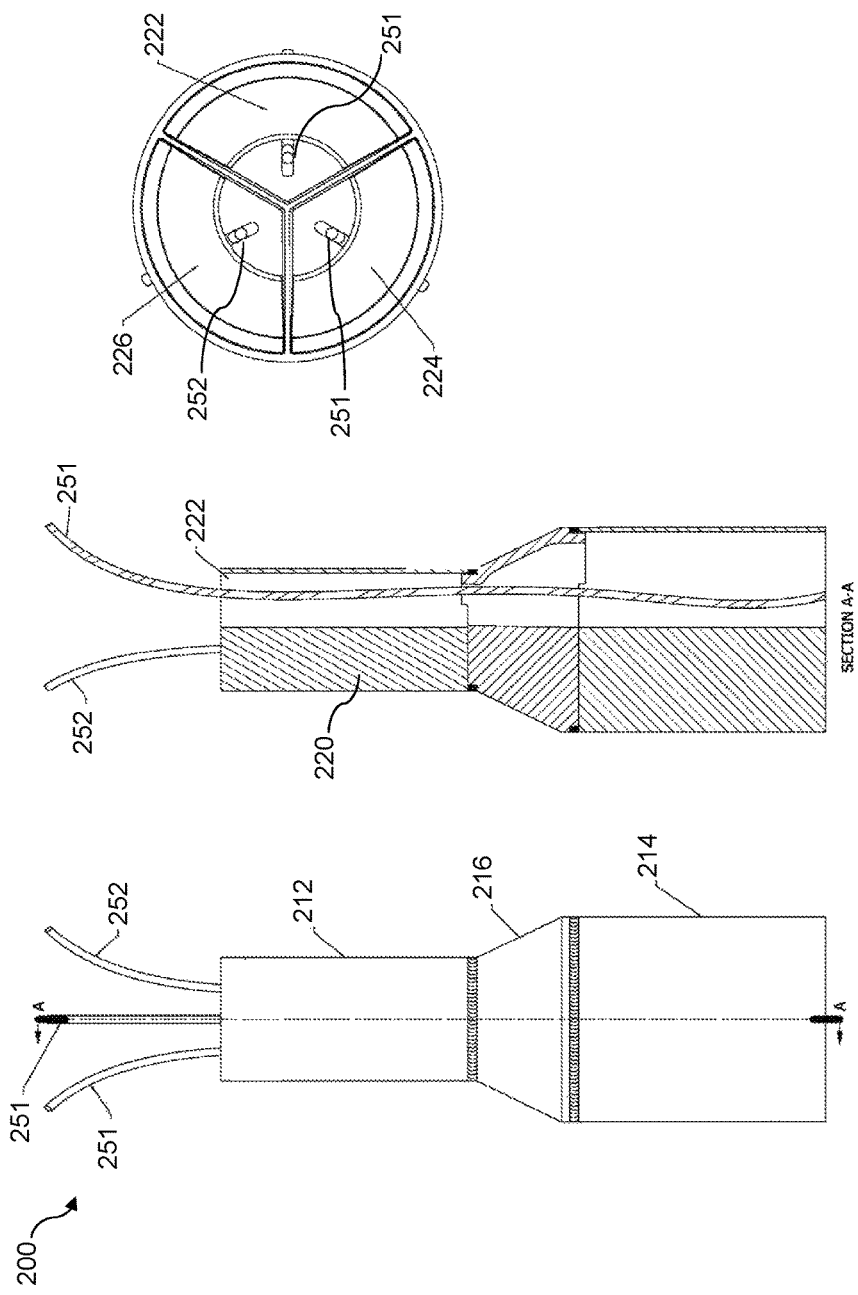

LIGHTING POLE WITH ISOLATED AXIAL CHAMBERS

CROSS REFERENCE TO RELATED APPLICATION

This application claims the benefit of Provisional U.S. Patent Application Ser. No. 62/517,288 filed on Jun. 9, 2017, the entire contents of which are incorporated herein by reference.

FIELD

The present disclosure relates to street light poles.

BACKGROUND

The addition of WIFI transmitters, closed-circuit television (CCTV) cameras and various other low voltage devices to roadway street lighting poles creates a concern for electro-magnetic interference (EMI). Street lights on roadway poles are typically powered by high voltage power lines that introduce a fair amount of electro-magnetic radiation within their close proximity. The recent addition of smaller, more delicate electronics gives rise to a concern for EMI. These electronics typically suffer signal degradation when introduced to EMI, thus causing a breakdown of clear video signal and loss of effective WIFI coverage amongst other issues. The industry has attempted to mitigate these issues with externally mounting the low-voltage lines in their own tubular chamber—such as PVC chambers—to the outside of the poles. This solution is not only aesthetically displeasing but is highly prone to vandalism and theft.

SUMMARY

A lighting pole is disclosed. The lighting pole comprises a hollow tube, and at least two nonintersecting walls extending over an axial length of the hollow tube to divide an interior of the hollow tube into at least three isolated chambers. At least one of the three isolated chambers defines a gap separating at least two of the isolated chambers.

A transition piece is disclosed. The transition piece comprises a hollow tube having an increasing diameter over an axial length of the hollow tube from a small-diameter region of the hollow tube to a large-diameter region of the hollow tube, and at least two nonintersecting walls extending over an axial length of the hollow tube to divide an interior of the hollow tube into at least three isolated chambers. At least one of the three isolated chambers defines a gap separating at least two of the isolated chambers.

BRIEF DESCRIPTION OF THE DRAWING FIGURES

The scope of the present disclosure is best understood from the following detailed description of illustrative embodiments when read in conjunction with the accompanying drawings. Included in the drawings are the following figures:

FIG. 2A shows a side view of an illustrative embodiment of a lighting pole.

FIG. 2B shows a longitudinal cross-sectional view of an illustrative embodiment of a lighting pole.

FIG. 2C shows a radial cross-sectional view of an illustrative embodiment of a lighting pole.

FIG. 3A shows a side view of an illustrative embodiment of a lighting pole.

FIG. 3B shows a longitudinal cross-sectional view of an illustrative embodiment of a lighting pole.

FIG. 3C shows a radial cross-sectional view of an illustrative embodiment of a lighting pole.

Figure 1:
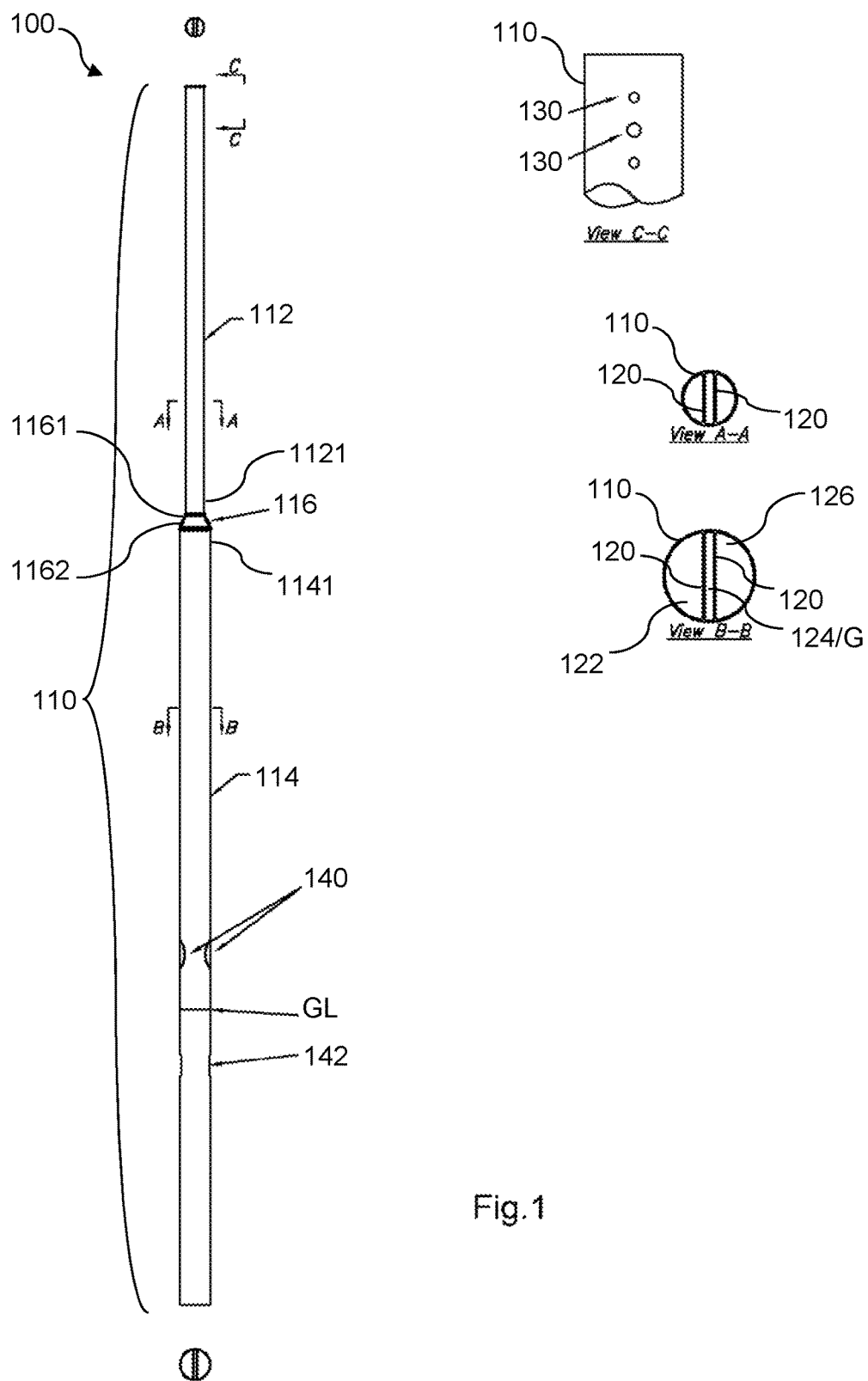
FIG. 1 shows a side view, top and bottom views, and three corresponding section views of an illustrative embodiment of a lighting pole.

Further areas of applicability of the present disclosure will become apparent from the detailed description provided hereinafter. It should be understood that the detailed description of illustrative embodiments are intended for illustration purposes only and are, therefore, not intended to necessarily limit the scope of the disclosure.

DETAILED DESCRIPTION

FIG. 1 shows an illustrative embodiment of a lighting pole 100.

In an illustrative embodiment, the lighting pole 100 includes a hollow tube 110 and two nonintersecting walls 120 extending over an axial length of the hollow tube 110 to divide an interior of the hollow tube 110 into at least three isolated chambers 122, 124, 126. At least one of the three isolated chambers 122, 124, 126 defines a separation gap G separating at least two of the isolated chambers 122, 124, 126.

In an illustrative embodiment, the cross sections of the isolated chambers 122, 126 form parts of a disc. An ordinarily skilled artisan will appreciate that other shapes of the disclosed hollow tube 110 and the isolated chambers 122, 124 and 126 can be implemented.

In an illustrative embodiment, the gap G has a width that is constant along the axial length of the hollow tube 110.

In an illustrative embodiment, the nonintersecting walls 120 are parallel over the axial length of the hollow tube 110.

In an illustrative embodiment, the hollow tube 110 comprises a first axial portion 112 having a first end 1121 with a first outer diameter, a second axial portion 114 having a second end 1141 with a second outer diameter greater than the first outer diameter, and a third axial portion 116 which connects the first end 1121 of the first axial portion 112 with the second end 1141 of the second axial portion 114. In an illustrative embodiment, the first and second axial portions 112, 114 are made of extruded aluminum. In an illustrative embodiment, the first outer diameter is 6 inches and the first axial portion 112 has a wall thickness of 0.25 inches. In an illustrative embodiment, the second outer diameter is 10 inches and the second axial portion 112 has a wall thickness of 0.25 inches. In an illustrative embodiment, the third axial portion 116 is a transition piece. In an illustrative embodiment, the transition piece 116 is a ring. In an illustrative embodiment, the transition piece 116 is made of cast aluminum. An ordinarily skilled artisan will appreciate that other outer diameters, wall thicknesses and materials can be implemented in the disclosed hollow tube 110.

In an illustrative embodiment, the third axial portion 116 provides continued segregation through the step down area between a larger second axial portion 114 and a smaller first axial portion 112.

In an illustrative embodiment, the third axial portion 116 has an increasing diameter over an axial length of the third axial portion from the first end 1121 of the first axial portion 112 to the second end 1141 of the second axial portion 114.

In an illustrative embodiment, the third axial portion 116 has a third end 1161 and a fourth end 1162, the third end 1161 mating with the first 1121 end of the first axial portion 112, and the fourth end 1162 mating with the second end 1141 of the second axial portion 114.

In an illustrative embodiment, the top side of the lighting pole 100 has appropriate structure for mounting a street lamp. In an illustrative embodiment a structure for mounting a street lamp includes holes 130. In an illustrative embodiment, the holes 130 include holes 130 of different diameters, for example, but not limited to, 0.4 inches and 0.563 inches. An ordinarily skilled artisan will appreciate that other diameters of the holes 130 can be implemented in the disclosed hollow tube 110 to accommodate various mounting mechanisms.

In an illustrative embodiment, the lighting pole 100 has appropriate structure for mounting within the ground. In an illustrative embodiment, such structure includes a handhole frame 140 above and near the expected ground level, and slotted wire holes 142 slightly below the expected ground level. Reference numeral GL in FIG. 1 denotes an illustrative reference ground line. An ordinarily skilled artisan will appreciate that the expected ground level can be situated at other axial locations along the disclosed hollow tube 110. In an illustrative embodiment, a handhole frame 140 is a 5 inch by 9 inch reinforced handhole frame 140. An ordinarily skilled artisan will appreciate that other dimensions of a handhole frame 140 can be implemented in the disclosed hollow tube 110. In an illustrative embodiment, the slotted wire holes 142 include two half-inch diameter, 8-inch long slotted wire holes. An ordinarily skilled artisan will appreciate that other numbers and dimensions of the slotted wire holes 142 can be implemented in the disclosed hollow tube 110.

FIG. 2 shows an illustrative embodiment of a lighting pole 100, in which the third end 1161 of the third axial portion 116 has a constant outer diameter from an outermost end of the third axial portion to a chamfered surface 1163 of the third axial portion 116, and the first end 1121 of the first axial portion 112 has an inner annular surface with a constant diameter matching the constant outer diameter of the third end 1161 of the third axial portion 116.

In an illustrative embodiment, the first end 1121 of the first axial portion 112 is welded to the third axial portion 116 at the chamfered surface 1163 of the third axial portion 116.

In an illustrative embodiment, the fourth end 1162 of the third axial 116 portion has a constant outer diameter from an outermost end of the third axial portion 116 to a chamfered surface 1164 of the third axial portion 116, and the second end 1141 of the second axial portion 114 has an inner annular surface with a constant diameter matching the constant outer diameter of the fourth end 1162 of the third axial portion 116.

In an illustrative embodiment, the second end 1141 of the second axial portion 114 is welded to the third axial portion 116 at the chamfered surface 1164 of the third axial portion 116.

in an illustrative embodiment, when the first axial portion 112 and the second axial portion 114 are attached to the third axial portion 116, they are oriented so that the respective walls 120 in the three axial portions 112, 114, 116 engage to define the isolated chambers 122, 124, 126 with the gap G along the entire axial length of the three axial portions 112, 114, 116. In use, higher power lines are provided in one of the chambers 122, 124, 126, and lower power lines are provided in the other chamber 122, 124, 126. Preferably, higher power lines are provided in one of the outer-most isolated chambers 122, 126 (which are separated by the isolated chamber 124/gap G), and lower power lines are provided in the other outer-most isolated chamber 126, 122.

The presence of the separation gap G between the isolated chambers 122, 126 can help ensure that electro-magnetic interference (EMI) is minimized or avoided. Furthermore, with this design in which the axial portions 112, 114 have a constant shape along their axis, the axial portions 112, 114 can be extruded to their desired respective length for a particular application, to be used with a cast transition piece 116. The ability to extrude the axial portions 112, 114 can reduce the overall manufacturing cost of the lighting tube 100. In an illustrative embodiment, the cast transition piece is less likely to need customization for a particular application due to its relatively short axial length.

In an illustrative embodiment, the isolated chamber 122 houses a low voltage wire bundle, such as, but not limited to, a WIFI and closed-circuit television (CCTV) cabling 150.

In an illustrative embodiment, the isolated chamber 126 houses a high power cable, such as, but not limited to, a lighting fixture power cable or a solar panel power cable.

In an illustrative embodiment, the isolated chambers 122, 124, 126 including the gap G are continuous from the top of the hollow tube 110 to the bottom of the hollow tube 110 to help mitigate electro-magnetic interference (EMI). In an illustrative embodiment, the gap G is 1-inch wide from the top of the hollow tube 110 to the bottom of the hollow tube 110. An ordinarily skilled artisan will appreciate that other widths for the gap G can be implemented in the disclosed hollow tube 110. In an illustrative embodiment, the depth of the gap G, in a direction perpendicular to the width and perpendicular to the longitudinal axis, correspondingly increases from near the top of the third axial portion 116 to near the bottom of the third axial portion 116.

FIG. 3 shows an illustrative embodiment of a lighting pole 200, which is similar to the lighting pole 100, including the features illustrated in FIG. 1, except for the arrangement of the interior walls 120 and interior chambers 122, 124, 126. In an illustrative embodiment, the lighting pole 200 three axial sections 212, 214, 216, and further includes three interior walls 220 which extend from the inner annular wall of a hollow tube 210 of the lighting pole 200 to meet in the middle of the lighting pole 200 and divide the interior of the lighting pole 200 into three isolated chambers 222, 224, 226. In an illustrative embodiment, the isolated chambers 222, 224, 226 are approximately equal in size. In use, two of the isolated chambers 222, 224 can accommodate low voltage wiring 251, and the isolated chamber 226 can accommodate high voltage wiring 252 (as shown in FIGS. 3A and 3C), or one isolated chamber 222 can accommodate low voltage wiring 251 while a single other isolated chamber 224 accommodates high voltage wiring 252 (as shown in FIG. 3B).

In an illustrative embodiment, the isolated chambers 222, 224, 226 are continuous from the top of the hollow tube 210 to the bottom of the hollow tube 210 to help mitigate electro-magnetic interference (EMI).

Illustrative embodiments of lighting poles disclosed herein can help mitigate the separation issue described in the Background section, by providing low-voltage lines within the pole itself, thus providing an aesthetically pleasing and secure solution while addressing the main concern of mitigating EMI.

The detailed description above describes features and aspects of embodiments of a storage case disclosed by way of example. The invention is not limited, however, to the precise embodiments and variations described. Changes, modifications and equivalents can be employed by one skilled in the art without departing from the spirit and scope of the invention as defined in the appended claims. It is expressly intended that all such changes, modifications and equivalents which fall within the scope of the claims are embraced by the claims.

What is claimed is:

1. A lighting pole comprising:
   a hollow tube comprising a first axial portion having a first end with a first outer diameter, a second axial portion having a second end with a second outer diameter greater than the first outer diameter, and a third axial portion which connects the first end of the first axial portion with the second end of the second axial portion; and
   at least two walls extending over an axial length of the hollow tube to divide an interior of the hollow tube into at least three isolated chambers,
   wherein at least one of the three isolated chambers defines a gap separating at least two of the at least three isolated chambers,
   wherein the first end of the first axial portion is welded to the third axial portion at a chamfered surface of the third axial portion,
   wherein the third axial portion has a third end and a fourth end, the third end mating with the first end of the first axial portion, and the fourth end mating with the second end of the second axial portion, and
   wherein the third end of the third axial portion has a constant outer diameter from an outermost end of the third axial portion to the chamfered surface of the third axial portion, and the first end of the first axial portion has an inner annular surface with a constant diameter matching the constant outer diameter of the third end of the third axial portion.

2. The lighting pole of claim 1, wherein the gap has a width that is constant along the axial length of the hollow tube.

3. The lighting pole of claim 1, wherein the at least two walls are parallel over the axial length of the hollow tube.

4. The lighting pole of claim 1, wherein the third axial portion has an increasing diameter over an axial length of the third axial portion from the first end of the first axial portion to the second end of the second axial portion.

5. The lighting pole of claim 1, wherein the fourth end of the third axial portion has a constant outer diameter from an outermost end of the third axial portion to second chamfered surface of the third axial portion, and the second end of the second axial portion has an inner annular surface with a constant diameter matching the constant outer diameter of the fourth end of the third axial portion.

6. The lighting pole of claim 5, wherein the second end of the second axial portion is welded to the third axial portion at the second chamfered surface of the third axial portion.

7. A lighting pole comprising:
   a hollow tube comprising a first axial portion having a first end with a first outer diameter, a second axial portion having a second end with a second outer diameter greater than the first outer diameter, and a third axial portion which connects the first end of the first axial portion with the second end of the second axial portion; and
   at least two walls extending over an axial length of the hollow tube to divide an interior of the hollow tube into at least three isolated chambers,
   wherein at least one of the three isolated chambers defines a gap separating at least two of the at least three isolated chambers,
   wherein the first end of the first axial portion is welded to the third axial portion,
   wherein the second end of the second axial portion is welded to the third axial portion at a chamfered surface of the third axial portion,
   wherein the third axial portion has a third end and a fourth end, the third end mating with the first end of the first axial portion, and the fourth end mating with the second end of the second axial portion, and
   wherein the third end of the third axial portion has a constant outer diameter from an outermost end of the third axial portion to a second chamfered surface of the third axial portion, and the first end of the first axial portion has an inner annular surface with a constant diameter matching the constant outer diameter of the third end of the third axial portion.

8. The lighting pole of claim 7, wherein the gap has a width that is constant along the axial length of the hollow tube.

9. The lighting pole of claim 7, wherein the at least two walls are parallel over the axial length of the hollow tube.

10. The lighting pole of claim 7, wherein the third axial portion has an increasing diameter over an axial length of the third axial portion from the first end of the first axial portion to the second end of the second axial portion.

11. The lighting pole of claim 7, wherein the first end of the first axial portion is welded to the third axial portion at the second chamfered surface of the third axial portion.

12. The lighting pole of claim 7, wherein the fourth end of the third axial portion has a constant outer diameter from a second outermost end of the third axial portion to the chamfered surface of the third axial portion, and the second end of the second axial portion has an inner annular surface with a constant diameter matching the constant outer diameter of the fourth end of the third axial portion.

* * * * *